(12) United States Patent  (10) Patent No.: US 9,909,781 B2
Sandmæl  (45) Date of Patent: Mar. 6, 2018

(54) SOLAR CELL ROOF TILES

(75) Inventor: Finn Sandmæl, Nesoya (NO)

(73) Assignee: FLAAX HOLDING AS, Nesoya (NO)

(*) Notice: Subject to any disclaimer, the term of this patent is extended or adjusted under 35 U.S.C. 154(b) by 0 days.

(21) Appl. No.: 13/508,317

(22) PCT Filed: Oct. 13, 2010

(86) PCT No.: PCT/NO2010/000360
§ 371 (c)(1),
(2), (4) Date: Jul. 24, 2012

(87) PCT Pub. No.: WO2011/056076
PCT Pub. Date: May 12, 2011

(65) Prior Publication Data
US 2012/0279555 A1    Nov. 8, 2012

(30) Foreign Application Priority Data
Nov. 6, 2009  (NO) .................................. 20093299

(51) Int. Cl.
H01L 31/042  (2014.01)
F24J 2/04    (2006.01)
(Continued)

(52) U.S. Cl.
CPC ........ *F24J 2/0455* (2013.01); *H01L 31/0508* (2013.01); *H01L 31/0521* (2013.01);
(Continued)

(58) Field of Classification Search
CPC ........ Y02B 10/12; Y02B 10/20; Y02B 10/70; H01L 31/0508; H01L 31/0521;
(Continued)

(56) References Cited

U.S. PATENT DOCUMENTS 3,985,116 A * 10/1976 Kapany ..................... F24J 2/04
136/248
4,083,360 A   4/1978 Courvoisier et al.
(Continued)

FOREIGN PATENT DOCUMENTS

CH   645 453 A5    9/1984
CN   1831447 A     9/2006
(Continued)

*Primary Examiner* — Tamir Ayad
*Assistant Examiner* — Uyen Tran
(74) *Attorney, Agent, or Firm* — Birch, Stewart, Kolasch & Birch, LLP

(57) ABSTRACT

A panel (105) is provided for utilizing solar energy, especially in the form of panels designed as roof tiles (101), wherein the heat is transferred from panel to fluid or vice versa. On this panel one or more solar cell panels (107) can be provided so that it is cooled effectively during operation, while heat energy simultaneously may be utilized. Panels, for example designed as roof tiles, individually or assembled, are mounted on roofing battens (110) suitable for the purpose, and connected to electrical connection points and bushings for fluid transport. The roofing battens (110) are mounted on furring ring strips (112) in the usual way. Some furring strips are used for connection of electrical conductors in the flooring battens (112) and any fluid circuits in the flooring battens (110). The construction facilitates installing and maintenance.

9 Claims, 4 Drawing Sheets

(51) Int. Cl.
*H01L 31/05* (2014.01)
*H01L 31/052* (2014.01)
*H02S 20/25* (2014.01)
*H02S 40/44* (2014.01)

(52) U.S. Cl.
CPC .............. *H02S 20/25* (2014.12); *H02S 40/44* (2014.12); *Y02B 10/12* (2013.01); *Y02B 10/20* (2013.01); *Y02B 10/70* (2013.01); *Y02E 10/44* (2013.01); *Y02E 10/50* (2013.01); *Y02E 10/60* (2013.01)

(58) Field of Classification Search
CPC ........ H02B 10/12; H02B 10/20; H02B 10/70; Y02E 10/50; Y02E 10/60; Y02E 10/44
USPC .................................................. 136/246, 248
See application file for complete search history.

(56) References Cited

U.S. PATENT DOCUMENTS

| | | | | |
|---|---|---|---|---|
| 4,202,319 A | * | 5/1980 | Vinz | 126/634 |
| 4,210,122 A | * | 7/1980 | Artweger | 126/622 |
| 4,373,308 A | * | 2/1983 | Whittaker | 52/173.3 |
| 4,630,421 A | * | 12/1986 | Diehl et al. | 52/408 |
| 5,768,831 A | | 6/1998 | Melchior | |
| 5,986,203 A | | 11/1999 | Hanoka et al. | |
| 2008/0135088 A1 | * | 6/2008 | Corrales | 136/246 |
| 2008/0283115 A1 | * | 11/2008 | Fukawa | H01L 31/048 136/246 |
| 2009/0084430 A1 | * | 4/2009 | Intrieri et al. | 136/246 |
| 2009/0223550 A1 | * | 9/2009 | Curtin et al. | 136/244 |
| 2009/0308020 A1 | * | 12/2009 | Duke | 52/745.2 |
| 2010/0043319 A1 | * | 2/2010 | Bennett | 52/173.3 |
| 2010/0307084 A1 | * | 12/2010 | Resso et al. | 52/302.1 |
| 2011/0044000 A1 | * | 2/2011 | Minano et al. | 361/699 |

FOREIGN PATENT DOCUMENTS

| | | | |
|---|---|---|---|
| CN | 101538916 A | 9/2009 | |
| DE | 28 51 975 A1 | 6/1980 | |
| DE | 29 20 997 A1 | 12/1980 | |
| DE | 3314637 A1 | 11/1983 | |
| DE | 196 03 540 A1 | 8/1997 | |
| DE | 102 31 726 A1 | 2/2004 | |
| EP | 0 110 836 A2 | 6/1984 | |
| EP | 0 335 261 A2 | 10/1989 | |
| EP | 1 860 706 A1 | 11/2007 | |
| FR | 2 349 702 A1 | 11/1977 | |
| WO | WO 99/14536 | 3/1999 | |
| WO | WO2008037016 | * 4/2008 | .......... H01L 31/052 |
| WO | WO2010053997 | * 5/2010 | .......... H01L 31/042 |

* cited by examiner

SOLAR CELL ROOF TILES

TECHNICAL FIELD

The present invention regards a device for utilizing solar energy, especially in the form of panels designed as roofing tiles.

TECHNICAL BACKGROUND

Solar energy panels have been known and used for a number of years, however they have become more interesting lately due to the increasing energy prices, environmental concerns, and an accelerating development of the production of solar cells for electric energy generation.

Solar energy has an energy density of approximately 1 kW/m2 at perpendicularly incident sunlight, distributed across a wide spectrum comprising infrared, visible, and ultraviolet light. This received energy may be utilized in several ways, among other by semiconductor based solar cells for electric current generation, and solar energy collectors for heating a medium for heating purposes.

Solar cell panels designed as roofing tiles are known, see U.S. Pat. No. 5,986,203; "Solar cell roof tile and method of forming same", disclosing roofing tiles comprising a solar cell, and U.S. Pat. No. 5,768,831; "Rooftile support for photocell panel", disclosing roofing tiles wherein a solar cell is provided onto each roof tile.

Solar collectors for roof mounting are known, ref. U.S. Pat. No. 4,202,319; "Building roof with solar collector", disclosing roofing tiles comprising a solar collector, and U.S. Pat. No. 4,083,360, disclosing a solar energy collecting system wherein translucent roofing tiles allow sunlight through to an absorbing sheet, wherein pipes with a liquid heat medium are provided to carry the heat.

The problems with the known art and the products on the markets are many:

The utilization factor is low, approx. 10% for solar cells, and the efficiency is reduced when the temperature rises.

For solar energy collectors the nature of energy is heat and not electrical energy, this limits the area of usability and the amount of energy which may be utilized in practice;

The complexity is high, and installation is preferably performed by specialists, this limits the spread in the market, especially in the do-it-yourself market;

Solar cells and solar collectors are fragile, which requires care at the production, installation, and maintenance such as for instance while removing snow from roof.

It is therefore a need for a solution which easily may be produced and installed, and which is energy efficient.

THE OBJECT OF THE INVENTION

In view of the known art, the object of the invention is to provide a sturdy device for efficient utilization of the energy of sunlight, suitable for easy production, installation and maintenance.

SUMMARY OF THE INVENTION

According to the invention this object is achieved with a device for utilizing the solar energy. This comprises a roof tiling base material and a panel with heat transfer between the surface and a fluid, wherein the panel is provided with at least one means for connecting to a collecting and distributing system for the heat transferring fluid. Onto this panel a solar cell panel may also be provided to be cooled effectively during operation, the heat energy may simultaneously be utilized.

Panels, for example designed as individual or assembled roofing tiles, mounted onto suitable roofing battens and connected to electrical junction points and to bushings for fluid transport. Roofing battens are mounted as normally on furring strips mounted parallel to the slope of the roof. Some furring strips are adapted for connection of electrical conductors in the roofing battens as well as any fluid circuits in the roofing battens.

SHORT DESCRIPTION OF THE DRAWINGS

The invention will in the following be described closer under reference to the drawings of the figures, showing a plurality of examples of implementations, and where FIG. 1 is a schematic view of a typical roof tile with area suitable for arranging a solar cell, and wherein the cooling is by fluid flowing through cavity in the roof tile;

REVIEW OF REFERENCE NUMBERS USED IN THE DRAWINGS AND IN THE BELOW DESCRIPTION

Figure 1:
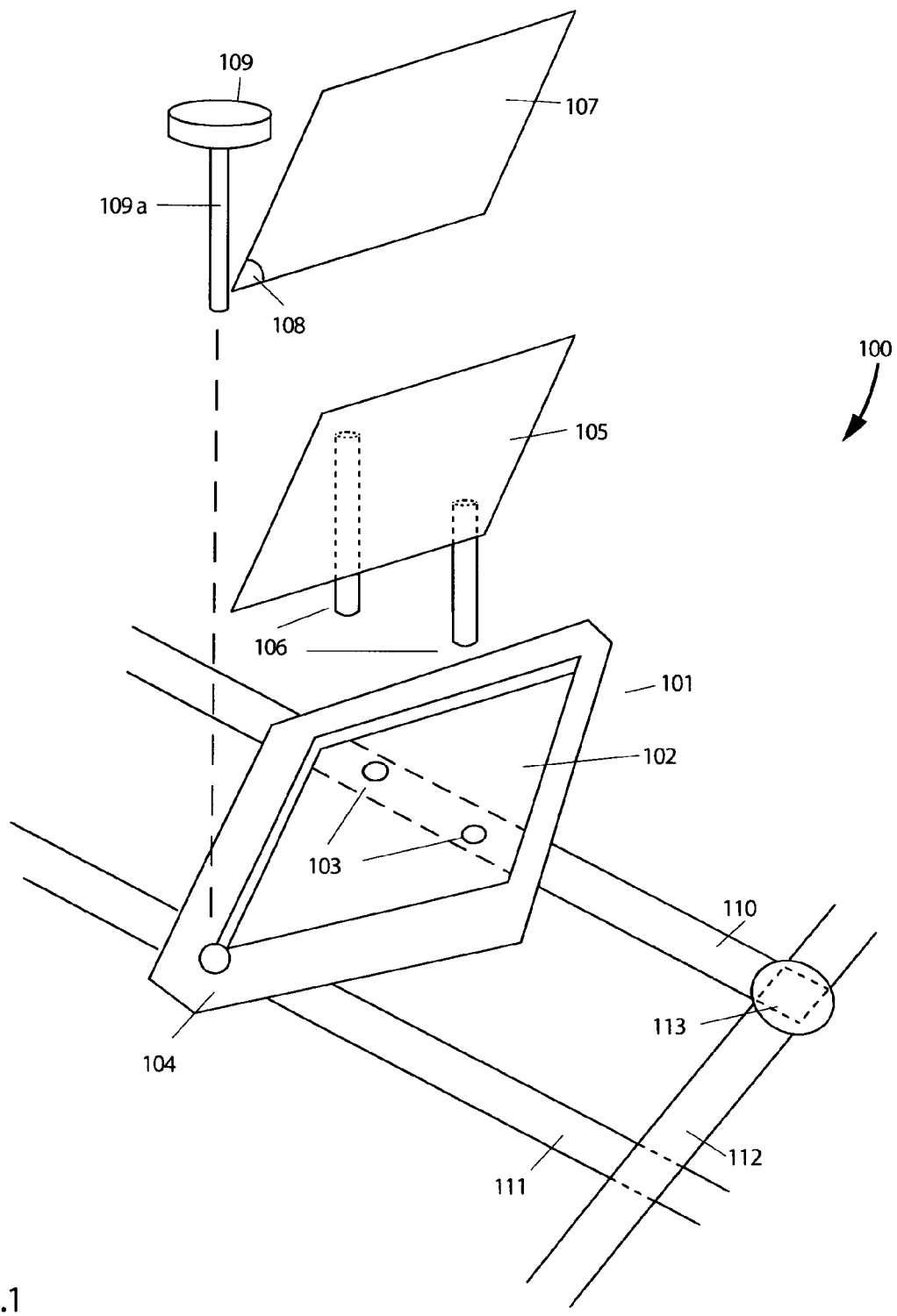

FIG. 1 is a view of a roof tile system 100 comprising at least one roof tile 101 with a diamond shaped, indented area 102 provided to mount a panel 105 for heat transfer. The panel 105 is a hollow element, typically produced from metal for good thermal conduction, and is equipped with pipe 106 which is in fluid communication with the cavity, for transport of fluid for transport of heat.

The panel 105 is provided onto the indented area 102 of the roof tile 101 for the pipes 106 to be thread through hole 103, for the pipes 106 to be fastened to a roofing batten 110 for mechanical attachment in a way which is similar to traditional mounting of roofing tiles on roofing battens as well as fluid connection to a collection and distribution system.

The roofing battens 110 are in at least one area connected together to for example a furring strip 112, with for example an adapter 113, so that a fluid for transport of heat is centralized collected and transferred. This facilitates laying of tubes and pipes and also secures correct spacing between the tiles.

When each tile is attached to the roofing battens, a fastening peg 109 is used to attach each roof tile through hole 104 in the lower edge of the roof tile, for in this way to secure it against strong wind blowing roof tiles off the roof. This enables also keeping light roof tiles safe in position. The fastening peg 109 may also be used as a step to stand on without causing damages.

On the panel 105 for heat transfer, a solar cell 107 may possibly be provided in such a way that the panel 105 maintains the solar cell 107 cool while also the thermal part of the received solar energy is utilized. The solar cell has typically two electrodes for transfer of electric current; one rear side electrode which is in electric contact with the panel 105 and further through pipe 106 to the roofing batten 110 and from there to furring strip 112; and a front side electrode 108 which is in electrical contact through the fastening peg 109 with pin 109a through hole 104 to an electric rail 111 which may correspond to the roofing batten 110 for other roof tiles which are offset laterally and in height relative to the roof tile 101.

In an implementation with solar cell on panel for heat transfer, the roofing batten 110, the furring strip 112 and the adapter 113 are provided with means for transfer and adaption of electric energy in addition to means for fluid transport. The adaption of electric energy comprises regulating the voltage supplied to the furring strip 112 and protection against electrical current flowing in the wrong direction.

It is an advantage that during manufacturing, the solar cell 107 is mounted onto the heat transfer panel 105 before this assembly then is mounted on the roof tile 101. This concentrates production requiring finer tolerances placing higher requirements for cleanliness in one place, before an assembly on more coarse material where cleanliness and tolerances are lower. Such mounting of solar cells makes the solar cell better protected and sturdier for later handling.

Figure 2:
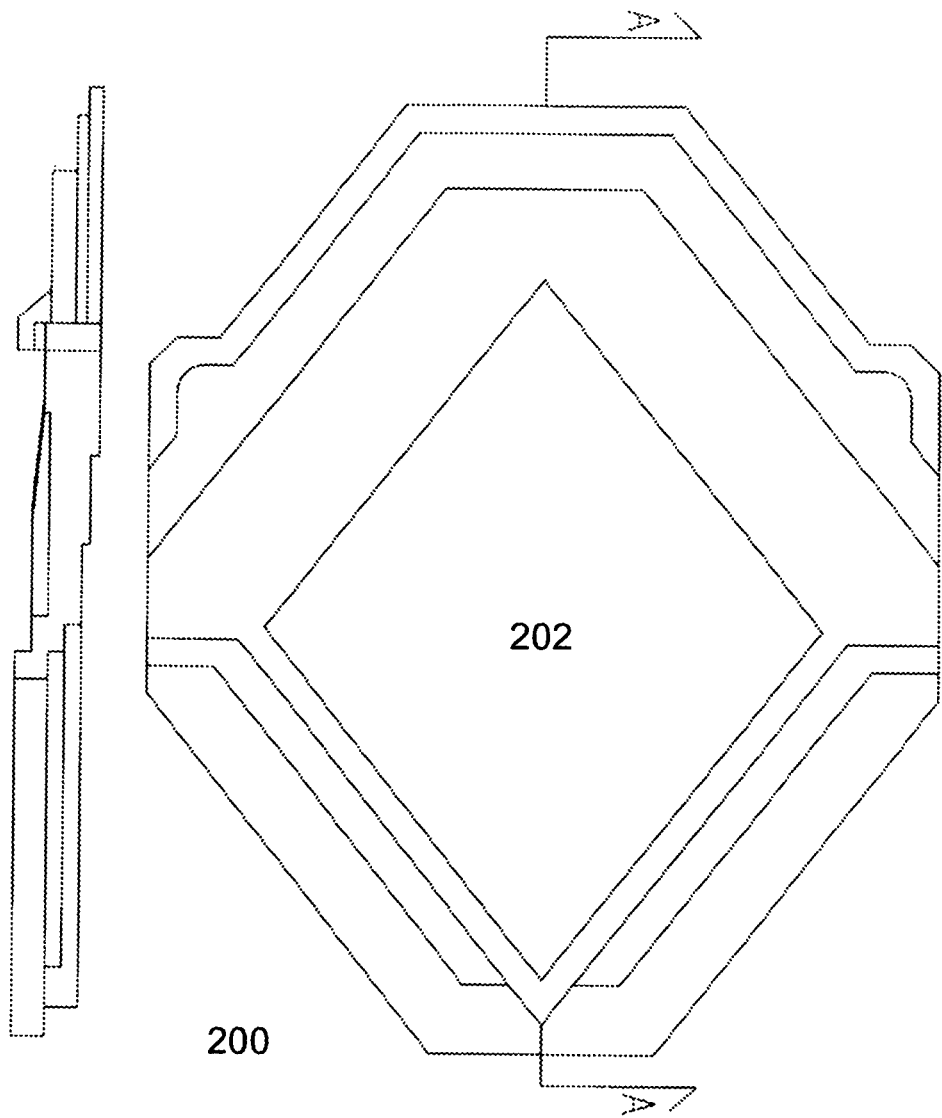
FIG. 2 is a schematic view of a typical roof tile with area suitable for arranging a panel for heat transfer, possibly with solar cell.

FIG. 2 shows an implementation of an individual roof tile 200 having an area 202 for mounting of a solar cell.

Figure 3:
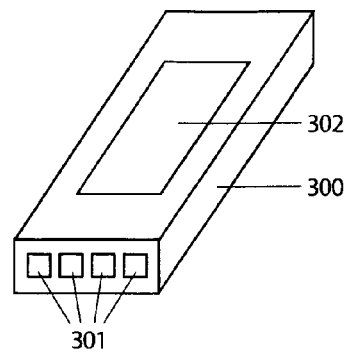
FIG. 3 is a schematic view of a typical roof tile with area suitable for arranging a solar cell, wherein the cooling is by fluid flowing through cavity between the roof tile and the base for the solar cell.

Heat transfer may occur in other ways which are also suitable for this invention. FIG. 3 shows an arrangement where the base is formed as elongated elements 300 which are provided with internal channels 301 for fluid transport, wherein the fluid transports the heat from a solar cell 302 and away. The elements are connected in a manifold, typically in ridges and lower edges of roof, for collection of the fluid for further transfer.

The roof tile units may also be produced as panels of a plurality of assembled panels. This facilitates the mounting as there will be fewer and larger units and fewer connection points to connect to. Another advantage is that the electrical connections may be provided as connections of individual panels vertically or diagonally, for in this way to avoid negative effects of shadow over the roofs or walls, for example from trees or poles. With diamond shaped individual roof tiles an easy way to connect panels diagonally is provided. Each roof tile may comprise a plurality of solar cells. A combination of 3×3 panels in one compound panel, wherein each panel comprises 4 solar cells and each solar cell outputs approximately 1 V, will provide approximately 36 V which is within the limit of what is allowed in the DIY market.

Figure 4:
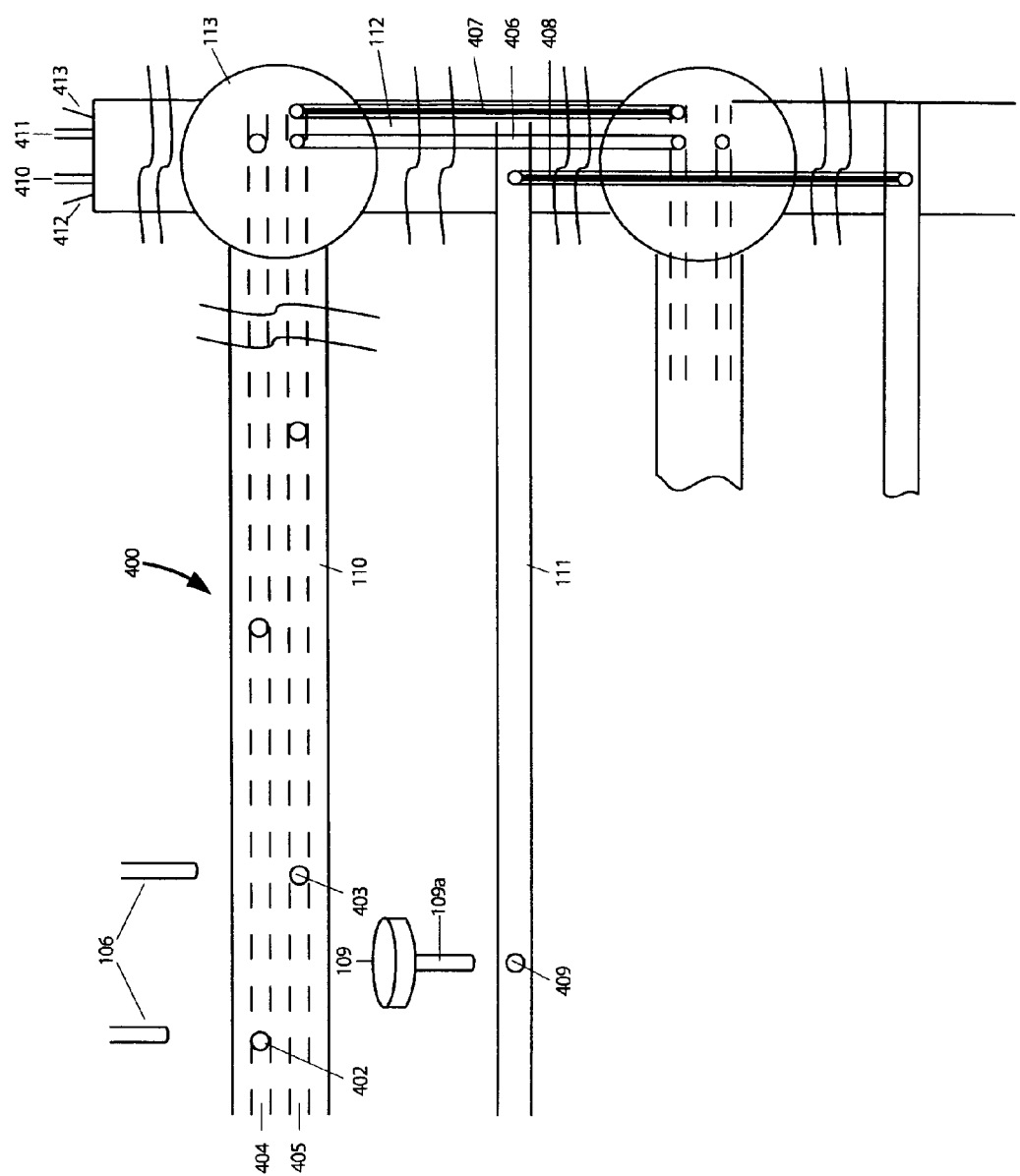
FIG. 4 is a schematic view of a typical implementation of roofing battens and furring strips for mounting of roofing tiles according to the invention.

For easy installation it is advantageous that roofing battens and furring strips are provided with prefabricated fittings for installation of the roof tile system. FIG. 4 shows an implementation 400 where the pipes 106 are connected to the roofing batten 110 so that fluid flows from one of the two holes 402 and 403 to the other hole. At least one of channels 404 and 405 for fluid transport is provided to make electric contact from an electrode through the pipes 106, while the fastening peg 109 with the pin 109a makes electric contact from another electrode to a fastening device 409 in rail 111 thereby to provide an electric circuit. The roofing battens are mounted in the normal manner on furring strips, wherein at least one furring strip is adapted to terminate fluid flows and electric current from roofing battens and rails. The roofing batten 110 is connected together with the furring strip 112 by the adapter 113 so that a disconnectable connection for fluid flow and electric current between the roofing batten and the rail is established. The furring strip 112 comprises means 406 which are provided for transfer of fluid flow between a plurality of roofing battens, and electric conductor 407 for transmission of electric current between a plurality of roofing battens and electrical conductor 408 for transmission of electrical current between a plurality of rails. The furring strip 112 also comprises end termination for fluid flow in junctions 410 and 411 and end terminations for electric current in connections 412 and 413.

In another implementation the roofing tiles are cooled by a sprinkler facility provided on top in a way that the water flows downwards the roofing tile system, where the water optionally passes through cavities beneath the solar cell 107. Filter may be provided in the fastening peg 109, which will then lead water to the next roofing tile below. The heated water is collected in gutters, thus exploiting existing structures in most houses.

Figure 5:
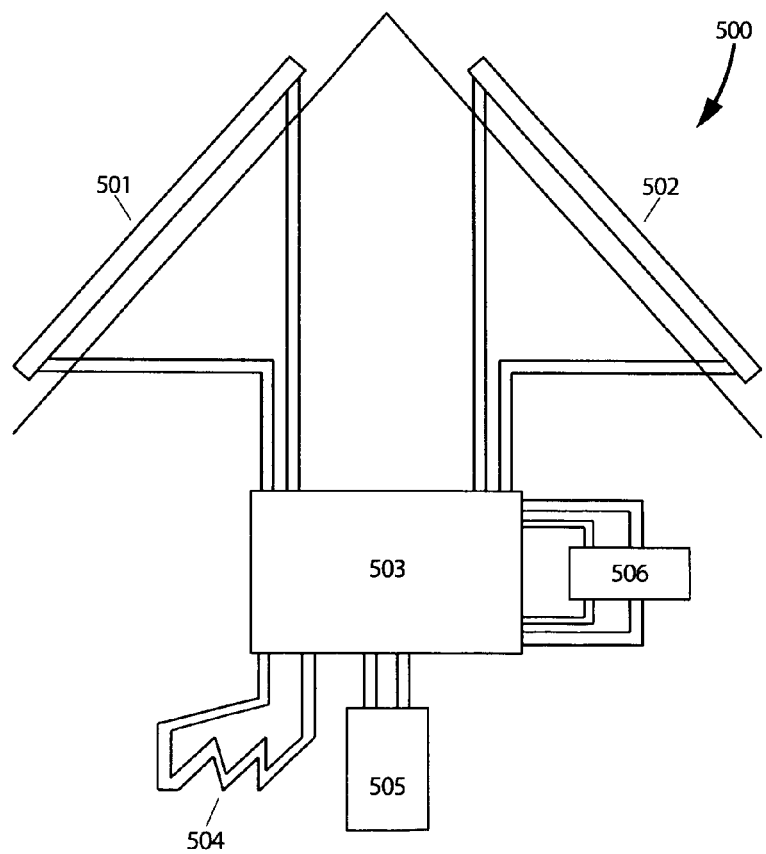
FIG. 5 is a schematic view of a heat circuit where the fluid cooling according to the invention is performed by roofing tiles with heat transfer panel without attached solar cell.

Thermal energy is more difficult to convert to other forms of energy than electric energy is. A result of this is that one may provide more thermal energy than can be directly utilized, especially in the warm season, even after heating water heater, rooms and thermal accumulator for storing heat until a need appears. A possible solution is using a Stirling engine to convert thermal energy to mechanical energy, and possibly from there to electric energy. In such cases a cold side with a large thermal sink is required. According to this invention it is also provided a possibility for using elements in the shadow like a radiator, for in this way to dissipate heat by convection and radiation. Areas which are not sufficiently lit by the sun to make the use of solar cells profitable may instead be provided with roofing tiles provided with panel for heat transfer 105 without solar cell 107. FIG. 5 shows a system where panel 501 is undergoing heating and provides thermal energy, and panel 502 is a thermal sink. Junction box 503 distributes usable heat to devices comprising heating system 504, typically implemented as radiators and water pipes, water heater 505, and Stirling engine 506.

It may also be advantageous to utilize the temperature difference between roofing tiles and water heater at night, especially in areas where there are great differences between day and night temperatures, like for example in a desert. In addition to increasing the efficiency due to temperature difference between day and night, this exposes the panels to lesser temperature oscillations by keeping fluid flowing through also while the sun goes down, than if the fluid flowing through had been discontinued.

The invention claimed is:

1. A device for utilizing solar energy, especially associated with an assembly of roofing tiles covering a roof surface, comprising:
  a roofing tile formed by a base material provided with an area; and a panel received in the area and configured to transfer heat between a surface of the panel and a heat transferring fluid;
  at least one solar cell panel; and
  a collection and distribution system, including:
    a roof batten;
    an electric rail arranged parallel with the roof batten; and
    a furring strip connected with the roof batten and the electric rail,
  wherein the panel is provided with at least one pipe for connection to the collection and distribution system for the heat transferring fluid, the at least one pipe being in direct fluid connection with the roof batten, and the panel includes a first surface directly contacting the heat transferring fluid supplied by the at least one pipe and a second surface, opposed to the first surface, configured to be installed directly thereon the at least one solar cell panel, wherein the at least one solar cell panel is arranged such that electric current from the at least one solar cell panel is transferred to the roofing batten through the at least one pipe, and is transferred to the electric rail through a connecting element connecting the at least one solar cell panel with the electric rail, and wherein the furring strip enables a fluid transmission between the roof batten and an adjacent roof batten, wherein the furring strip comprises a first conductor configured to transmit a first electric current between the roof batten and the adjacent roof batten, wherein the furring strip comprises a second electrical conductor configured to transmit a second electric current between the electric rail and an adjacent electrical rail.

2. The device according to claim 1, wherein the base material is provided with a plurality of channels, so that the heat transfer is achieved by fluid flowing through the plurality of channels provided in the base material.

3. The device according to claim 1, wherein the panel is provided with a cavity to enable heat transfer by fluid flow through the panel for heat transfer provided on the base material.

4. The device according to claim 1, wherein the connecting element comprises a pin for transferring of the electric current.

5. The device according to claim 4, wherein the roofing batten and the electric rail for transferring of the electric current are connected to the furring strip with an adapter unit for further transferring of the electric current.

6. The device according to claim 1, wherein the roof tiles are assembled into panels with a plurality of assembled panels.

7. The device according to claim 1, wherein electrical connections in assembled panels are provided as connections of individual panels vertically or horizontally.

8. The device according to claim 2, wherein the panel is provided with a cavity to enable heat transfer by fluid flow through the panel for heat transfer provided on the base material.

9. A device for utilizing solar energy, especially associated with an assembly of roofing tiles covering a roof surface, comprising:

a roofing tile formed by a base material, and configured to be mounted to an electric rail, which is corresponding to a roofing batten, via a fastener, the roof tile including a frame with an indented portion defining a receiving area;

a collection and distribution system, including:
the roof batten;
the electric rail arranged parallel with the roof batten; and
a furring strip connected with the roof batten and the electric rail;

a panel having an interior surface defining a hollow cavity, the panel being received in the receiving area and configured to transfer heat between a surface of the panel and a heat transferring fluid, wherein the panel is provided with at least one pipe configured to be connected to the collection and distribution system for the heat transferring fluid, the at least one pipe being in direct fluid connection with the roof batten, and the at least one pipe leads the heat transferring fluid into the hollow cavity of the panel so that the interior surface of the panel directly contacts the heat transferring fluid; and at least one solar cell panel directly installed on a top surface of the panel, the at least one solar cell panel including a rear side electrode in electric contact with the panel and a front side electrode in electric contact with the electric rail through the fastener, wherein the at least one solar cell panel is arranged such that electric current from the at least one solar cell panel is transferred to the roofing batten through the at least one pipe, and is transferred to the electric rail through the fastener connecting the at least one solar cell panel with the electric rail, and wherein the furring strip enables a fluid transmission between the roof batten and an adjacent roof batten, wherein the furring strip comprises a first conductor configured to transmit a first electric current between the roof batten and the adjacent roof batten, wherein the furring strip comprises a second electrical conductor configured to transmit a second electric current between the electric rail and an adjacent electrical rail.

* * * * *